(12) United States Patent
Willenbring et al.

(10) Patent No.: US 12,733,099 B2
(45) Date of Patent: Sep. 8, 2026

(54) ELECTRONICS PACKAGING FOR MOVING PLATFORMS

(71) Applicant: Simmonds Precision Products, Inc., Vergennes, VT (US)

(72) Inventors: Gary Willenbring, Waconia, MN (US); Jason Graham, Prior Lake, MN (US); Neal R. Whatcott, Carver, MN (US); Jacob Modjeski, Saint Paul, MN (US)

(73) Assignee: Raytheon Company, Arlington, VA (US)

( * ) Notice: Subject to any disclaimer, the term of this patent is extended or adjusted under 35 U.S.C. 154(b) by 1052 days.

(21) Appl. No.: 17/705,352

(22) Filed: Mar. 27, 2022

(65) Prior Publication Data

US 2023/0328888 A1 Oct. 12, 2023

(51) Int. Cl.

| | |
|---|---|
| ***H05K 1/14*** | (2006.01) |
| ***F42B 15/01*** | (2006.01) |
| ***H05K 3/00*** | (2006.01) |
| ***H05K 7/14*** | (2006.01) |

(52) U.S. Cl.

CPC ............. *H05K 1/144* (2013.01); *F42B 15/01* (2013.01); *H05K 3/0014* (2013.01); *H05K 7/1434* (2013.01)

(58) Field of Classification Search

USPC ......... 361/715–730, 752–756, 790, 807–810

See application file for complete search history.

(56) References Cited

U.S. PATENT DOCUMENTS

| | | | | |
|---|---|---|---|---|
| 2,976,806 A | | 3/1961 | Risk et al. | |
| 5,499,164 A | * | 3/1996 | Hill-Lindsay | H05K 7/1434 361/752 |
| 5,536,177 A | * | 7/1996 | Casey | H05K 7/023 439/74 |
| 6,056,237 A | * | 5/2000 | Woodland | B64D 1/02 244/49 |
| 6,126,109 A | * | 10/2000 | Barson | F42B 10/14 244/3.28 |
| 6,138,951 A | * | 10/2000 | Budris | B64G 1/645 102/393 |
| 6,351,383 B1 | | 2/2002 | Payton | |
| 6,735,086 B1 | | 5/2004 | Weber et al. | |
| 6,892,646 B1 | * | 5/2005 | Zimmerman | F42B 15/08 361/752 |
| 8,189,345 B2 | | 5/2012 | Rapp et al. | |
| 8,552,349 B1 | * | 10/2013 | Alexander | F41G 7/346 701/470 |
| 8,942,005 B2 | | 1/2015 | Geswender | |
| 9,434,485 B1 | * | 9/2016 | Lehocki | B64G 1/403 |
| 11,284,522 B2 | * | 3/2022 | Powell | H05K 3/368 |
| 11,457,546 B2 | * | 9/2022 | Dube | H05K 7/1432 |
| 11,561,325 B2 | * | 1/2023 | Ulmer | G01W 1/11 |
| 2003/0209789 A1 | * | 11/2003 | Hanson | G01C 21/166 257/678 |
| 2021/0085163 A1 | * | 3/2021 | Chen | A61B 1/0011 |

* cited by examiner

*Primary Examiner* — Tuan T Dinh

(57) ABSTRACT

In accordance with at least one aspect of this disclosure, a system includes one or more electronics boards and one or more plates configured to interleave the one or more electronics boards in a stack along an axis. When in the stack, an outer surface of the one or more plates is configured to form an outer mold line of a portion of a moving platform. Each of the one or more plates includes an inner diameter and an outer diameter, where the outer surface has an outer circumference at the outer diameter.

20 Claims, 2 Drawing Sheets

ELECTRONICS PACKAGING FOR MOVING PLATFORMS

TECHNICAL FIELD

The present disclosure relates to electronics packaging, and more particularly to electronics packaging in moving platforms (e.g., munitions).

BACKGROUND

Implementation of guidance systems into smaller and smaller munitions requires more efficient packaging of components. Typical mechanical designs have consisted of multiple parts each with a dedicated purpose. For example, conventional packaging can include retainer rings to secure assemblies together, structure for thermal management, a 'can' that holds an electrical device such as a global positioning system (GPS) or an inertial measurement system (IMS), and a mechanical 'skin' that forms the desired aerodynamic shape necessary for flight vehicle are just a few. These single purpose parts increase total part count, assembly labor, and cost, and can result in inefficient packaging and less reliability.

There remains a need in the art for improvements, e.g., in the aerospace industry for more compact and efficient electronics packaging in munitions. This disclosure provides a solution for this need.

SUMMARY

In accordance with at least one aspect of this disclosure, a system includes one or more electronics boards and one or more plates configured to interleave the one or more electronics boards in a stack along an axis. When in the stack, an outer surface of the one or more plates is configured to form an outer mold line of a portion a moving platform. Each of the one or more plates includes an inner diameter and an outer diameter, where the outer surface has an outer circumference at the outer diameter.

In embodiments, the outer surface of the one or more plates can be configured to be machined to alter a profile of the outer mold line without changing a profile of the inner diameter of the one or more plates.

In embodiments, the one or more plates can be formed from a thermally conductive material. In certain embodiments, the one or more plates can be configured to dissipate heat from the one or more electronics boards at a center of the one or more plates radially outward towards the outer surface of the one or more plates and to the ambient atmosphere. In certain embodiments, the one or more plates can be configured to thermally conduct heat from the one or more electronics boards at a center of the one or more plates radially outward towards the outer diameter of the one or more plates to store heat in the outer circumference of the one or more plates.

In embodiments, each of the one or more plates can include at least one keyway and at least one key defining the inner diameter and the outer diameter. The keyway can be configured to accept a respective key of a joining plate of the one or more plates in the stack. When stacked, at least one keyway and at least one key can be configured to prevent rotation of the one or more plates about the axis.

In embodiments, when stacked the one or more electronics boards can be seated within the inner diameter of the one or more plates such that the one or more keys enclose the one or more electronics boards. In certain embodiments, when in the stack, the one or more electronics boards are shielded from external forces and/or impacts.

In embodiments, when in the stack, a face of the one or more electronics boards can seat against a face of a respective one or more plates to prevent bending of the one or more electronics boards during acceleration of the moving platform. In certain embodiments, each of the one or more plates can also include one or more vias defined therethrough configured to allow communication between the one or more electronics boards through the one or more plates.

In embodiments, the system can include the moving platform, and when stacked, the one or more plates are configured to form at least a portion of a nose of the moving platform. The moving platform can include a guided munition, and the one or more electronics boards can form at least a portion of a sensor package of a seeker. In certain embodiments, the seeker can further include an antenna disposed on a terminal plate of the one or more plates.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
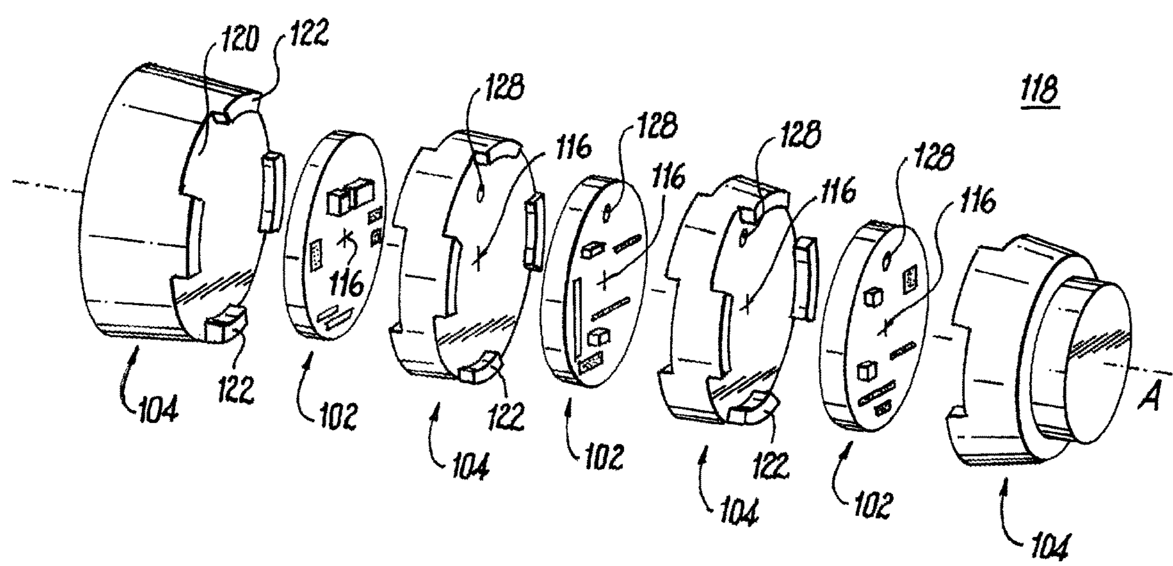
FIG. 1 is an exploded perspective view of a system in accordance with this disclosure, showing electronics packaging within a portion of a moving platform.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 1-4. Certain embodiments described herein can be used to more effectively package electronics within a moving platform.

In accordance with at least one aspect of this disclosure, as shown in FIGS. 1-4, a system 100 can include one or more electronics boards 102 and one or more plates 104 configured to interleave the one or more electronics boards 102 in a stack along an axis A. As shown, the one or more electronics boards 102 and one or more plates 104 can include any suitable number of boards 102 or plates 104 as needed or desired. The total number of plates 104 can be one greater than the number of boards 102. As used herein below, the one or more electronics boards 102 and one or more plates 104 will be referred to as "boards 102" and "plates 104," for the sake of clarity.

When in the stack, an outer surface 106 of the plates 104 is configured to form an outer mold line of a portion a moving platform 108. In embodiments, the plates 104 can be configured to form at least a portion of a nose 110 of the moving platform 108 (e.g., where the outer mold line includes a tapered profile as shown, or any other suitable aerodynamic profile). The moving platform 108 can include a guided munition, for example, and the boards 102 can form at least a portion of a sensor package of a seeker.

Figure 3:
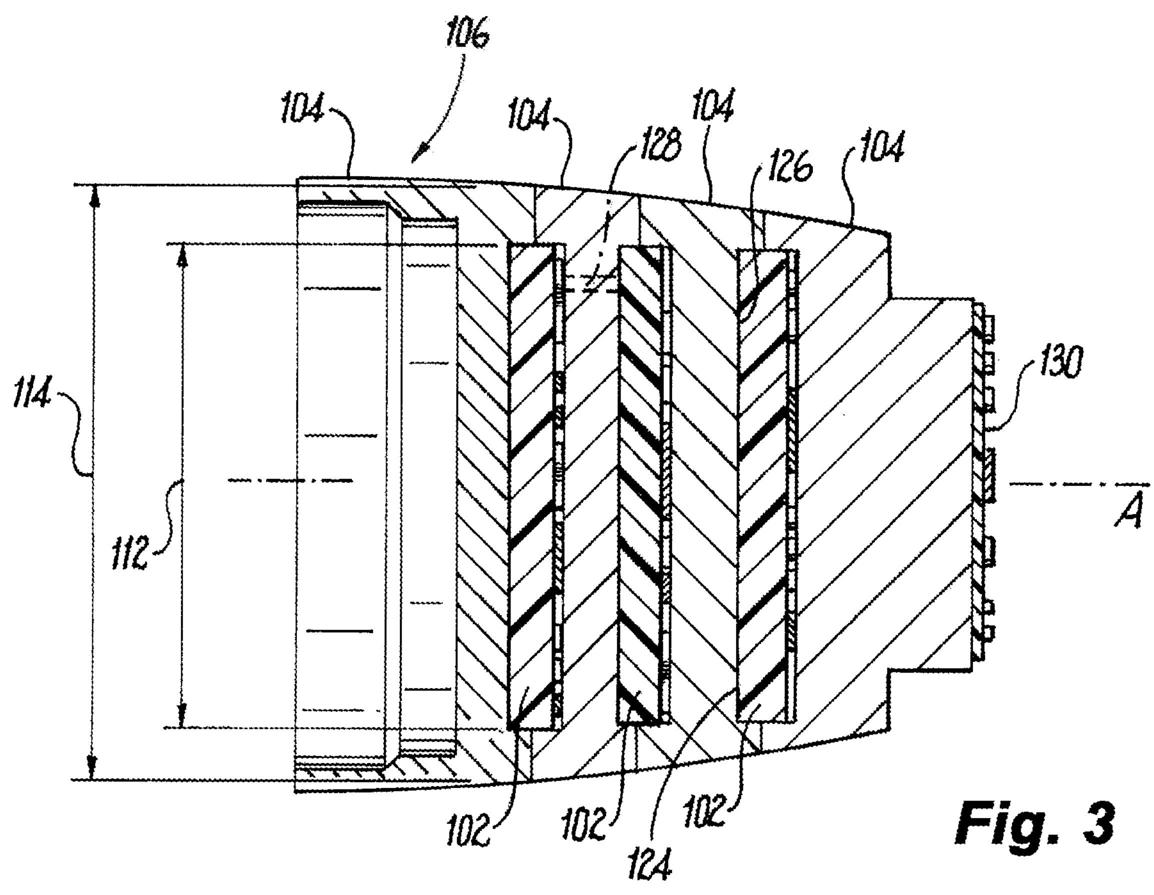
FIG. 3 is a schematic cross-sectional view of the assembled electronics packaging of FIG. 2.
Figure 4:
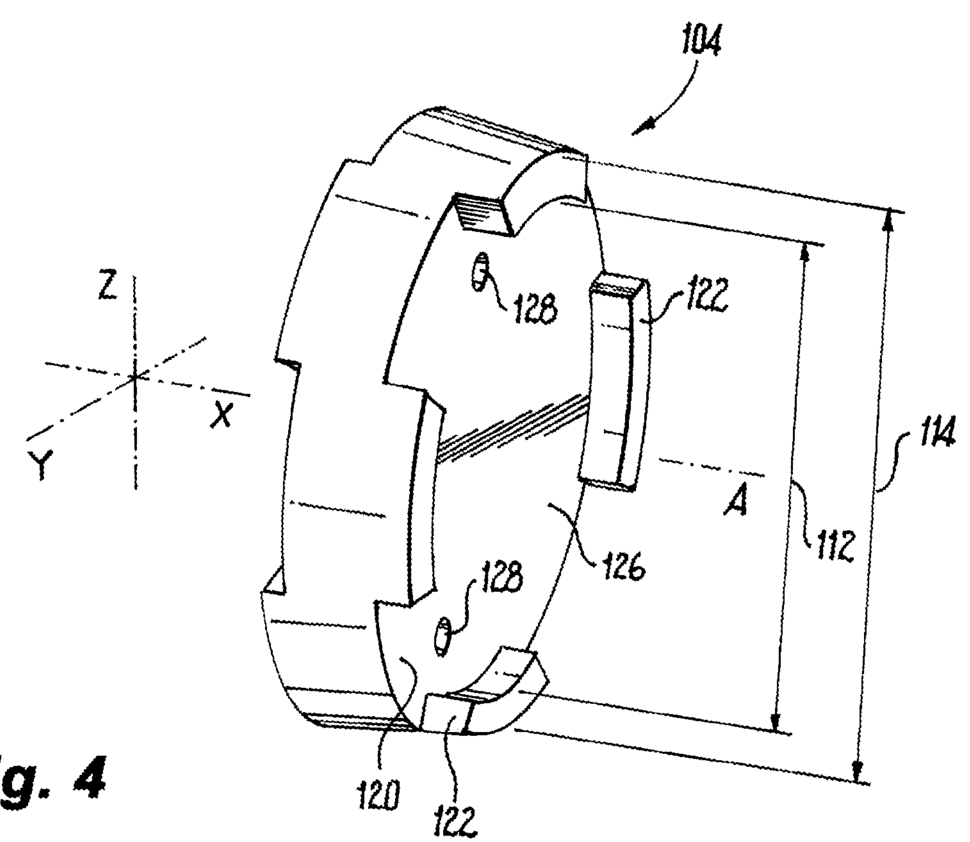
FIG. 4 is a perspective view of a component of the electronics packaging of FIGS. 1-3.

As shown in FIGS. 3-4, each of the plates 104 can include an inner diameter 112 and an outer diameter 114, where the outer surface 106 has an outer circumference at the outer diameter 114. In embodiments, the outer surface 106 of the plates 104 can be machined and shaped for a given application or munition profile. The design or contour of the outer surface 106 of the plates 104 can also be configured to be altered (e.g., via machining) to include a different profile to fit a different or new application, without changing a profile of the inner diameter 112 of the plate or plates 104. For example, the outer surface of plates 104 can be designed for a first application, and then may be redesigned to be reused or repurposed in a second application, where the outer mold line of the munition in the second application is different than the first application. However, in each application (where possible) the inner diameter 112 remains the same, thus the same or similar boards 102 can be used regardless of changes to the outer surface design without further redesign.

In embodiments, the plates 104 can be formed from a thermally conductive material (e.g., metal). In certain embodiments, the plates 104 can be configured to dissipate heat from the electronics boards 102 at a center 116 of the plates 104 radially outward towards the outer surface 106 of the plates 104 and to the ambient atmosphere 118. In certain embodiments, the plates 104 can be configured to thermally conduct heat from the boards 102 at a center 116 of the plates 104 radially outward towards the outer diameter 114 of the plates 104 to store heat in the outer circumference of the plates 104. In both instances, the plates 104 can act as heatsinks for the heat generating components on the boards 102.

Figure 2:
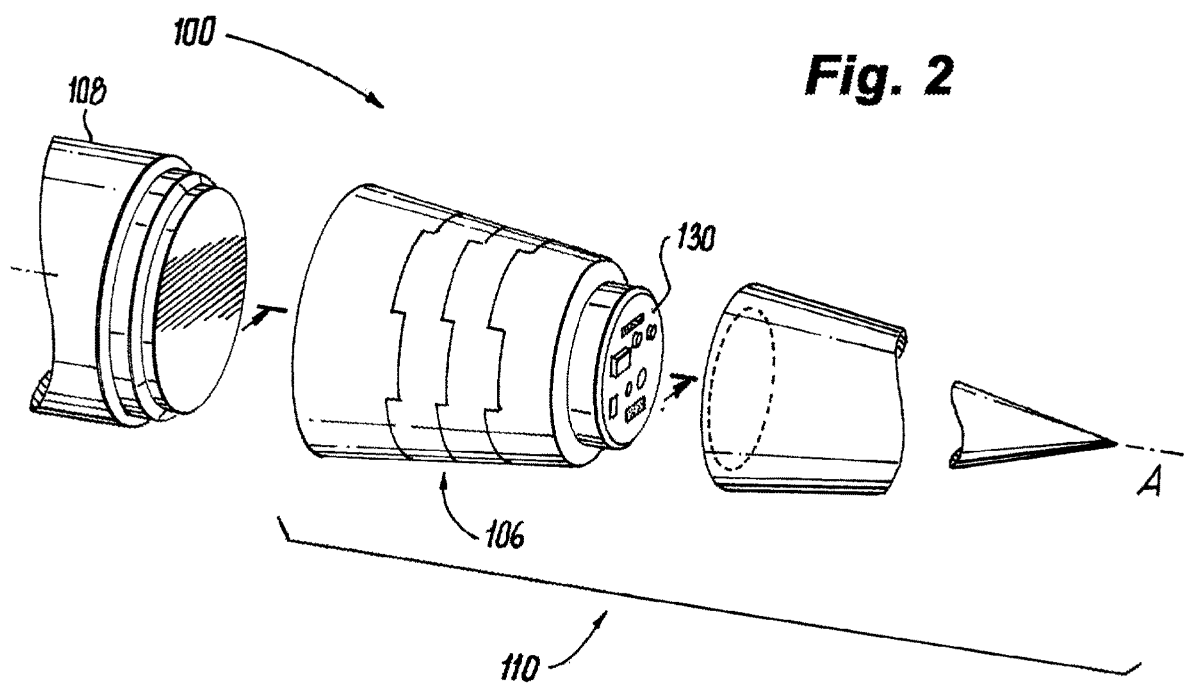
FIG. 2 is a partially exploded perspective view of the moving platform of FIG. 1, showing the electronics packaging assembled.

As shown in FIG. 4, in embodiments, each of the plates 104 can include at least one keyway 120 and at least one key 122. The keyways 120 and keys 122 can define the inner diameter 112 and the outer diameter 114. Each keyway 120 can be configured to accept a respective key 122 of a joining plate 104 in the stack, where the keys 122 and keyways 120 have complimentary shapes (e.g., as shown in FIGS. 1-3). When stacked, the keyways 120 and keys 122 can be configured to prevent rotation of the plates 104 about the axis A, such as when the munition 108 is accelerating through a barrel.

With reference again to FIGS. 1-3, when stacked, the boards 102 can be seated within the inner diameter 112 of the plates 104 such that the keys 122 entirely enclose the boards 102. Thus when in the stack, the boards 102 are shielded from direct external forces or impacts. For example, shielding the electronics boards 102 in this manner can protect the boards 102 if the munition is dropped or impacted by other equipment during transit or handling.

In embodiments, when in the stack, a face 124 (e.g., an aft facing face) of the boards 102 can seat against a face 126 (e.g., a forward facing face) of a respective plate 104 to prevent bending of the electronics boards 102 during acceleration of the munition 108. In certain embodiments, one or more of the plates 104 can also include one or more vias 128 (e.g., electrical vias) defined therethrough to allow communication between the boards 102 through the one or more plates 104 when in the stack. The vias 128 may also allow for communication between the boards 102 and other electrical components included in the munition 108. In certain embodiments, a terminal plate, such as the plate the most forward, can include an antenna 130 disposed on an outward facing surface of the plate 104.

In accordance with at least one aspect of this disclosure, a method can include packaging electronics components (e.g., boards 102) within a munition (e.g., munition 108), such that certain individual parts to contribute in more than one way, so as to achieve a seeker and its integration to the host platform.

Embodiments include electronics boards interleaved with mechanical structures. Electrical interfaces across the boards can be standardized with commercial connectors that serve as a digital backbone for passing information across the assembly. Additionally, a power rail within the board can be consistent and standardized across the boards with respect to location and voltage level.

The mechanical structures can act as a container for the electronics. Keyways can control movement to assist with assembly and once fielded, in the most demanding orientations discussed later in this section. Bolts can be placed between the mechanical structures parallel to the axis to hold the structures together as the layers are built up.

In embodiments, each plate serves multiple functions. The first function of the plate is the shape of plate's outer circumference can form any profile needed by the host application. The plates can be stacked together into an assembly to form an aerodynamic outer mold line required by the airframe for the given application. Modern machining can provide a smooth transition between the plates and at plate junctions when assembled.

Second, multiple structural requirements can be addressed with each plate. First, sufficient mass exists to protect the electronics boards and electronics thereon from external impacts during handling. Second, during the launch process extensive accelerations are exerted on the body. Here, the keyways can provide rigidity in y and z orientations as well as rotationally. Moreover, the keys/keyways can prevent rotation of the plates about the x-axis relative to one another, and add additional rigidity against bending that may be caused by the rotational forces the munition may experience from rifled barrels. Linear acceleration in the x direction is accounted for by the lands and valleys of the keys and keyways creating a load path support structure. In traditional systems, an unsupported board, or inadequately supported board may experience a 'trampoline dynamic' at the center of a board. In embodiments however, each plate provides sufficient rigidity to mitigate this behavior through the nature of its dish design (e.g., where the boards are seated within the plates).

Third, each plate can contribute to the thermal management of the electronics. Certain electronics cards on the boards can generate a significant amount of heat. The plates can provide a thermal path from the center of the plate out to the edges for storage or dissipation. Thus, mass for structural strength as described above can also serve as a thermal sink.

The low cost and technical complexity allows the plates as shown and described to be tailored for a variety of applications for minimal cost and schedule while preserving the higher complexity electrical boards, because the inner portions of the plates that house the boards need not be changed with the outer surface.

The system and methods described herein includes efficient packaging for electronics, for example in in limited volume weapons. The system can include fewer parts to manage, fewer parts that may create tolerance stackup issues, and allow fewer assembly steps. Customizable plates provide adaptability across multiple different munitions through plate outer surface tailoring, where said tailoring requires minimal engineering labor. Additionally, when tailoring only the outer surface of the plates, the electronic configuration within the plates and on the boards can be maintained across multiple weapons.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system, comprising:

one or more electronics boards; and one or more plates configured to interleave the one or more electronics boards in a stack along an axis, each plate including a face configured to seat against a majority of a face of one of the one or more electronic boards;

wherein, in the stack, an outer surface of the one or more plates is configured to form an outer mold line of a portion of an exterior surface of a moving platform, and wherein the outer surface has an outer circumference at an outer diameter of each of the one or more plates.

2. The system according to claim 1, wherein each of the one or more plates includes an inner diameter.

3. The system according to claim 2, wherein the outer surface of the one or more plates is configured to be machined to alter a profile of the outer mold line without changing a profile of the inner diameter of the one or more plates.

4. The system according to claim 2, wherein the one or more plates are formed from a thermally conductive material.

5. The system according to claim 4, wherein the one or more plates are configured to dissipate heat from the one or more electronics boards at a center of the one or more plates radially outward towards the outer surface of the one or more plates and to an ambient atmosphere.

6. The system according to claim 4, wherein the one or more plates are configured to thermally conduct heat from the one or more electronics boards at a center of the one or more plates radially outward towards the outer diameter of the one or more plates to store heat in the outer circumference of the outer surface.

7. The system according to claim 2, wherein each of the one or more plates includes at least one keyway and at least one key defining the inner diameter and the outer diameter, each keyway configured to accept a respective key of a joining plate of the one or more plates in the stack.

8. The system according to claim 7, wherein, in the stack, the at least one keyway and the at least one key are configured to prevent rotation of the one or more plates about the axis.

9. The system according to claim 7, wherein, in the stack, the one or more electronics boards are seated within the inner diameter of the one or more plates such that multiple keys enclose the one or more electronics boards.

10. The system according to claim 9, wherein, in the stack, the one or more electronics boards are shielded from external impacts.

11. The system according to claim 9, wherein, in the stack, the majority of the face of each of the one or more electronics boards seats against the face of a respective plate of the one or more plates to prevent bending of the one or more electronics boards during acceleration of the moving platform.

12. The system according to claim 11, wherein each of the one or more plates further includes one or more vias defined therethrough, the one or more vias configured to allow communication between the one or more electronics boards through the one or more plates.

13. The system according to claim 1, further comprising the moving platform, wherein, in the stack, the one or more plates are configured to form at least a portion of an exterior surface of a nose of the moving platform.

14. The system according to claim 13, wherein the moving platform includes a guided munition.

15. The system according to claim 14, wherein the one or more electronics boards form at least a portion of a sensor package of a seeker.

16. A system, comprising:

multiple electronics boards; and multiple plates configured to interleave the electronics boards in a stack along an axis, each plate including a face configured to seat against a majority of a face of one of the multiple electronic boards;

wherein, in the stack, outer surfaces of the plates form an outer mold line of a portion of an exterior surface of a movable platform; and wherein the outer surface has an outer circumference at an outer diameter of each of the one or more plates.

17. The system according to claim 16, wherein each of the plates includes an inner diameter.

18. The system according to claim 16, wherein the plates are configured to dissipate heat from the electronics boards radially outward.

19. The system according to claim 16, wherein:

each of the plates includes at least one keyway and at least one key; and for each plate, the at least one keyway is configured to accept the at least one key of an adjacent one of the plates in the stack.

20. The system according to claim 16, wherein the plates further include vias configured to allow communication between the electronics boards through the plates.

* * * * *